(12) United States Patent
Yang et al.

(10) Patent No.: US 9,647,065 B2
(45) Date of Patent: May 9, 2017

(54) BIPOLAR TRANSISTOR STRUCTURE HAVING SPLIT COLLECTOR REGION AND METHOD OF MAKING THE SAME

(71) Applicant: TAIWAN SEMICONDUCTOR MANUFACTURING COMPANY, LTD., Hsinchu (TW)

(72) Inventors: Fu-Hsiung Yang, Zhongli (TW); Long-Shih Lin, Zhubei (TW); Kun-Ming Huang, Taipei (TW); Chih-Heng Shen, Zhubei (TW); Po-Tao Chu, New Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 287 days.

(21) Appl. No.: 14/056,393

(22) Filed: Oct. 17, 2013

(65) Prior Publication Data

US 2015/0108542 A1  Apr. 23, 2015

(51) Int. Cl.
*H01L 29/08*  (2006.01)
*H01L 29/739*  (2006.01)
*H01L 29/66*  (2006.01)

(52) U.S. Cl.
CPC ...... *H01L 29/0821* (2013.01); *H01L 29/0834* (2013.01); *H01L 29/6625* (2013.01); *H01L 29/66325* (2013.01); *H01L 29/7393* (2013.01)

(58) Field of Classification Search
CPC ........... H01L 29/0821; H01L 29/66325; H01L 29/7393; H01L 29/6625; H01L 29/0834
See application file for complete search history.

(56) References Cited

U.S. PATENT DOCUMENTS

| 6,133,607 | A  | * | 10/2000 | Funaki | H01L 29/7394 257/327 |
| 2008/0001195 | A1 | * | 1/2008 | Chiang | H01L 21/82389 257/296 |
| 2012/0119318 | A1 | * | 5/2012 | Tokura | H01L 29/0696 257/489 |
| 2014/0008723 | A1 | * | 1/2014 | Lin | H01L 29/0634 257/336 |

OTHER PUBLICATIONS

"A High Performance IGBT with New n+Buffer Structure", 1995 International Symposium on Power Semiconductor Devices & ICs, Yokahama.*
"Buried Gate SOI LIGBT without Latch-up Susceptibility", IEEE International SOI conference, Oct. 1998.*

* cited by examiner

*Primary Examiner* — Eva Y Montalvo
*Assistant Examiner* — Nga Doan
(74) *Attorney, Agent, or Firm* — Hauptman Ham, LLP

(57) ABSTRACT

A bipolar transistor includes a substrate and a first well in the substrate, the first well having a first dopant type. The bipolar transistor further includes a split collector region in the first well. The split collector region includes a highly doped central region having a second dopant type opposite the first dopant type; and a lightly doped peripheral region having the second dopant type, the lightly doped peripheral region surrounding the highly doped central region. A dopant concentration of the lightly doped peripheral region is less than a dopant concentration of the highly doped central region.

20 Claims, 5 Drawing Sheets

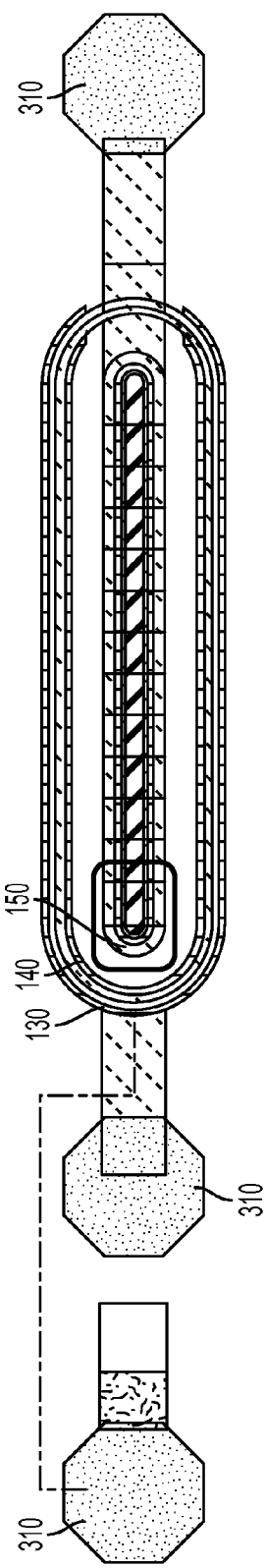
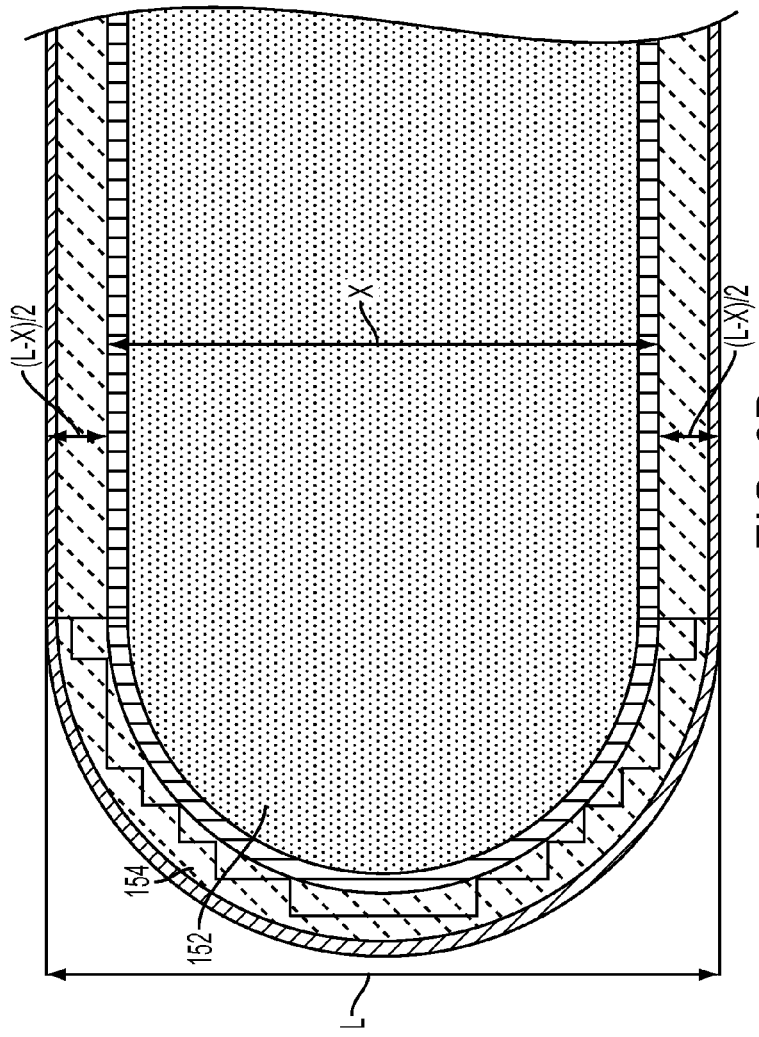
FIG. 3A
FIG. 3B

BIPOLAR TRANSISTOR STRUCTURE HAVING SPLIT COLLECTOR REGION AND METHOD OF MAKING THE SAME

BACKGROUND

Technological advances in semiconductor integrated circuit (IC) materials, design, processing, and manufacturing have enabled ever-shrinking IC devices, where each generation has smaller and more complex circuits than the previous generation.

Bipolar transistors are used to selectively connect electrically separate devices in an integrated circuit. Performance of a bipolar transistor is measured using a turn-off time, a time period between the bipolar transistor receiving a turn off signal and the bipolar transistor becoming non-conductive. Performance of a bipolar transistor is also measured by a voltage drop across the bipolar transistor, which is determined, in some instance, by an on-state resistance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 3A is a top view of a bipolar transistor having a split collector region in accordance with one or more embodiments;

FIG. 3B is a top view of a split collector region for a bipolar transistor in accordance with one or more embodiments;

Various embodiments of the present invention will be explained in detail with reference to the accompanying drawings.

DETAILED DESCRIPTION

The following disclosure provides many different embodiments, or examples, for implementing different features of the invention. Specific examples of components and arrangements are described below to simplify the present disclosure. These are examples and are not intended to be limiting.

Spatially relative terms, such as "beneath," "below," "lower," "above," "upper", "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Figure 1:
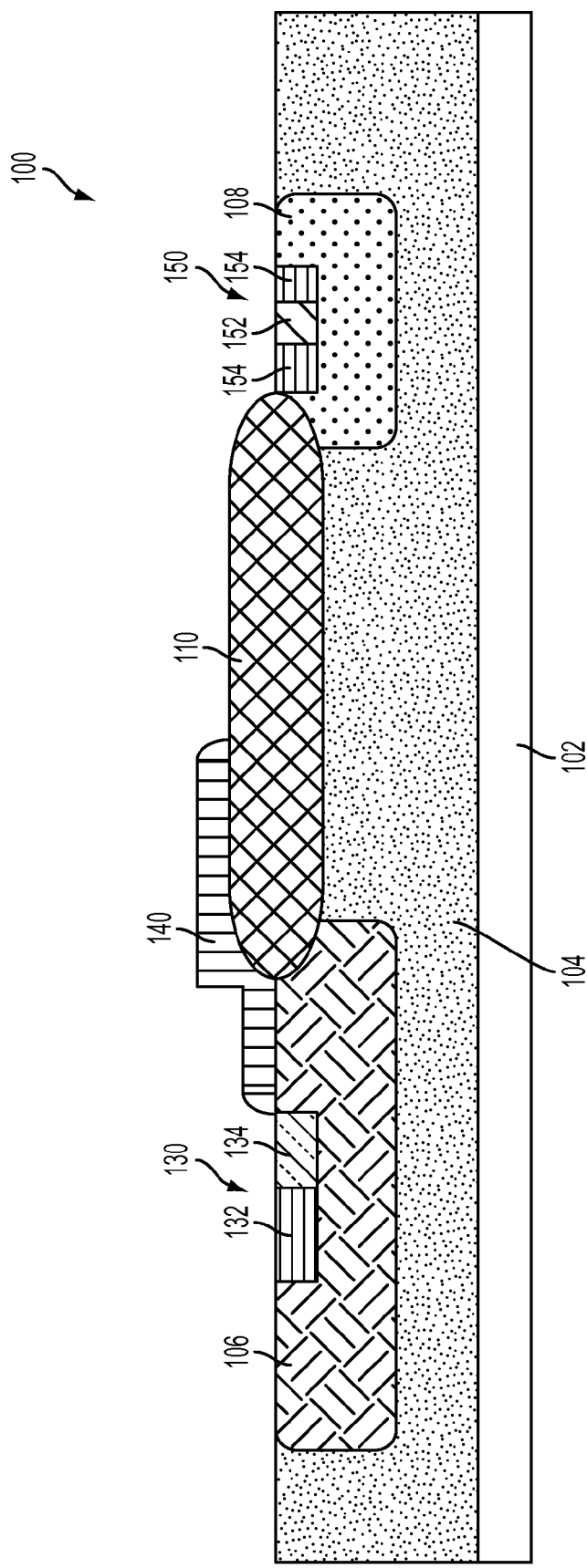
FIG. 1 is a cross-sectional view of a bipolar transistor having a split collector region in accordance with one or more embodiments.

FIG. 1 is a cross-sectional view of a bipolar transistor 100 having a split collector region 150 in accordance with one or more embodiments. Bipolar transistor 100 includes a substrate 102. A deep n-well 104 is in substrate 102. A field oxide 110 is over the deep n-well 104 and a gate 140 is partly overlying field oxide 110. An emitter region 130 and split collector region 150 are on opposite sides of gate 140. Emitter region 130 includes a pair of oppositely doped, i.e., one p-doped and one n-doped, regions 132 and 134 contained in a p-well 106. Split collector region 150 includes a highly doped central region 152 surrounded by a lightly doped peripheral region 154 contained in an n-well 108.

In some embodiments, bipolar transistor 100 is a lateral insulated gate bipolar transistor (LIGBT). In some embodiments, bipolar transistor 100 is a bipolar junction transistor (BJT) or another type of bipolar transistor.

In some embodiments, substrate 102 is a lightly doped substrate having a first type of conductivity. Bipolar transistor 100 is an n-type transistor, and thus, the substrate 102 includes a p-type silicon substrate (p-substrate) or an SOI (silicon on isolator) substrate. In some embodiments, bipolar transistor 100 is a p-type transistor and substrate 102 includes an n-type dopant (n-substrate) or an SOI (silicon on isolator) substrate. In some embodiments, substrate 102 is a semiconductor wafer, such as a silicon wafer. Alternatively or additionally, substrate 102 includes other semiconductors, such as germanium, silicon carbide, gallium arsenic, indium arsenide, and indium phosphide, in some embodiments. In some embodiments, substrate 102 includes an alloy semiconductor, such as silicon germanium, silicon germanium carbide, gallium arsenic phosphide, and gallium indium phosphide.

Deep n-well 104 is in substrate 102. In some embodiments, deep n-well 104 is formed using an SOI wafer. In some embodiments, deep n-well 104 is formed using an implantation process. In some embodiments, deep n-well 104 is formed in substrate 102 using a doped epitaxial process. In some embodiments, the dopant is added during the epitaxial process. In some embodiments, the dopant is implanted following the epitaxial process. In some embodiments, the n-type dopants include arsenic, phosphorous or other suitable n-type dopants.

P-well 106 is in substrate 102 over deep n-well 104. In some embodiments, p-well 106 is formed using an implantation process. In some embodiments, p-well is formed in substrate 102 using a doped epitaxial process. In some embodiments, the dopant is added during the epitaxial process. In some embodiments, the dopant is implanted following the epitaxial process. In some embodiments, the p-type dopants include boron, boron difluoride, gallium or other suitable p-type dopants.

N-well 108 is in substrate 102 above deep n-well 104. In some embodiments, n-well 108 is formed using an implantation process. In some embodiments, p-well is formed in substrate 102 using a doped epitaxial process. In some embodiments, the dopant is added during the epitaxial process. In some embodiments, the dopant is implanted following the epitaxial process. In some embodiments, the n-type dopants include arsenic, phosphorous or other suitable n-type dopants. In some embodiments, a dopant species in n-well 108 is a same dopant species as in deep n-well 104. In some embodiments, the dopant species in n-well 108 is different from the dopant species in deep n-well 104.

Field oxide 110 is over a top surface of substrate 102. In some embodiments, field oxide 110 includes a dielectric, such as silicon oxide, nitride, or other suitable insulating materials. In some embodiments, field oxide 110 is formed by a thermal oxide process. Substrate 102 is patterned to protect regions where field oxide 110 is undesirable and the substrate is subjected to a high temperature, for example, about 800 degrees Celsius, in the presence of oxygen.

Emitter region 130 is formed in a top surface of p-well 106, across gate 140 from split collector region 150. Emitter region 130 has two oppositely doped regions 132 and 134, both formed in the top surface of p-well 106. A first region 132 of emitter region 130 has a first type of conductivity. In some embodiments, the conductivity type of first region 132 is the same as that of substrate 102. A second region 134 of emitter region 130 has a second type of conductivity, which is the same as deep n-well 104. For example in FIG. 1, first region 132 includes p-type dopants such as boron, boron difluoride, gallium or other suitable p-type dopants. In some embodiments, a dopant species of first region 132 is a same dopant species as substrate 102. In some embodiments, the dopant species of first region 132 is different from the dopant species of substrate 102. Second region 134 includes n-type dopants, such as arsenic, phosphorous, or other suitable n-type dopants. In some embodiments, a dopant species of second region 134 is a same dopant species as deep n-well 104. In some embodiments, the dopant species of second region 134 is different from the dopant species of deep n-well 104. In some embodiments, first region 132 includes n-type dopants and second region 134 includes p-type dopants. In some embodiments, emitter region 130 is formed using ion implantation, diffusion, or another suitable formation method. A rapid thermal annealing (RTA) process is used to activate the implanted dopants, in some embodiments.

Gate 140 has a first portion overlying the p-well 106 and a second portion overlying field oxide 110. In some embodiments, gate 140 includes a gate dielectric and a gate electrode formed on the gate dielectric. The gate dielectric includes a silicon oxide layer suitable for high voltage applications, in some embodiments. Alternatively, the gate dielectric includes a high-k dielectric material, silicon oxynitride, other suitable materials, or combinations thereof, in some embodiments. In some embodiments, the high-k material is selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. In some embodiments, the gate dielectric has a multilayer structure, such as one layer of silicon oxide and another layer of high-k material. In some embodiments, the gate dielectric is formed using chemical vapor deposition (CVD), physical vapor deposition (PVD), atomic layer deposition (ALD), thermal oxide, other suitable processes, or combinations thereof.

The gate electrode is disposed overlying the gate dielectric. In some embodiments, the gate electrode includes a doped or non-doped polycrystalline silicon (or polysilicon). Alternatively, the gate electrode layer include a metal, such as Al, Cu, W, Ti, Ta, TiN, TaN, NiSi, CoSi, other suitable conductive materials, or combinations thereof, in some embodiments. In some embodiments, the gate electrode is formed by CVD, PVD, ALD, plating, or other processes. In some embodiments, the gate electrode has a multilayer structure and is formed in a multiple-step process.

Split collector region 150 is formed in a top surface of n-well 108, across gate 140 from emitter region 130. Split collector region 150 has highly doped central region 152 surrounded by lightly doped peripheral region 154. Highly doped central region 152 has a same dopant type as lightly doped peripheral region 154. For example in FIG. 1, highly doped central region 152 and lightly doped peripheral region 154 include p-type dopants such as boron, boron difluoride, gallium or other suitable p-type dopants. In some embodiments, a dopant species of highly doped central region 152 is a same dopant species as lightly doped peripheral region 154. In some embodiments, the dopant species of highly doped central region 152 is different from the dopant species of lightly doped peripheral region 154.

A dopant concentration in highly doped central region 152 is about 50 times to about 200 times greater than a dopant concentration in lightly doped peripheral region 154. In some embodiments, the dopant concentration in highly doped central region 152 is about 100 times greater than the dopant concentration in lightly doped peripheral region 154. In some embodiments, the dopant concentration of lightly doped peripheral region 154 ranges from about $5 \times 10^{12}$ ions/cm$^3$ to about $5 \times 10^{13}$ ions/cm$^3$.

In some embodiments, emitter region 130 is formed using ion implantation, diffusion, or another suitable formation method. A rapid thermal annealing (RTA) process is used to activate the implanted dopants, in some embodiments.

Figure 2:
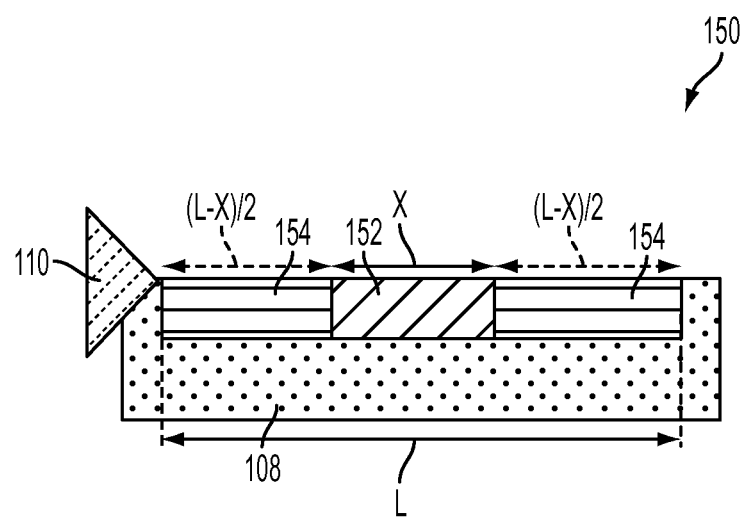
FIG. 2 is a cross-sectional view of a split collector region for a bipolar transistor in accordance with one or more embodiments.

FIG. 2 is a cross-sectional view of split collector region 150 for a bipolar transistor in accordance with one or more embodiments. Split collector region 150 includes highly doped central portion 152 surrounded by lightly doped peripheral portion 154. Split collector region 150 has a length L. In some embodiments, length L ranges from about 10 microns (μm) to about 30 μm. Highly doped central region 152 has a length X parallel to length L. In some embodiments, a ratio between length X and length L ranges from about 0.8 to about 0.9. Lightly doped peripheral region 154 has a same width on both sides of highly doped central region 152. A length of lightly doped peripheral region 154 on each side of highly doped central region 152 is equal to (L−X)/2.

FIG. 3A is a top view of a bipolar transistor 100 having a split collector region 150 in accordance with one or more embodiments. Bipolar transistor 100 includes emitter region 130 on a first side of gate 140 and split collector region 150 on a second side of the gate opposite the emitter region. Bipolar transistor 100 also includes contacts 310 electrically connected to emitter region 130, gate 140 and split collector region 150 to connect the bipolar transistor to other devices in an integrated circuit.

FIG. 3B is a top view of split collector region 150 for a bipolar transistor in accordance with one or more embodiments. Split collector region 150 includes highly doped central portion 152 surrounded by lightly doped peripheral portion 154. Lightly doped peripheral portion 154 completely surrounds highly doped central portion 152, and the highly doped central portion is centered in the lightly doped peripheral portion.

Split collector region 150 provides an advantage of a collector region having a uniform dopant concentration throughout. In comparison with a uniform dopant concentration collector region, split collector region 150 has a decreased turn-off time. A decrease in turn-off time means that when a signal applied to gate 140 indicates bipolar transistor 100 should transition from a conductive state to a non-conductive state, the transition occurs faster in structures which include split collector region 150. Table I below indicates that a turn-off time for a bipolar transistor having a split collector region is approximately as must as 52% faster than a bipolar transistor having a uniform dopant concentration collector region. The decreased turn-off time is provided for different combinations of direct current voltage and current levels. By decreasing the turn-off time, power consumption of the bipolar transistor is decreased and artificial signal delays to other devices within a current connected to bipolar transistor 100 are able to be reduced, thereby increasing an overall speed of the circuit.

TABLE I

| | Turn-off Time | | | |
|---|---|---|---|---|
| | Current | 155 V | 311 V | 373 V |
| Uniform dopant concentration collector region | 0.5 A | 778.667 ns | 570.667 ns | 554.667 ns |
| | 1 A | 698.667 ns | 448.000 ns | 432.000 ns |
| Split collector region | 0.5 A | 373.0 ns | 333.0 ns | 344.0 ns |
| | 1 A | 361.0 ns | 273.0 ns | 271.0 ns |
| Percent Reduction | 0.5 A | 52.1% | 41.6% | 38.7% |
| | 1 A | 48.3% | 39.1% | 37.3% |

Decreasing an overall dopant concentration of a collector region would result in a decreased conductivity of the bipolar transistor in comparison with a bipolar transistor having a higher dopant concentration in the collector region. The decreased conductivity results in an increased resistance to charge transfer from the emitter region to the collector region. Increased resistance in turn increases power consumption by the bipolar transistor. Decreasing an overall size of collector region will also reduce turn-off time, but the bipolar transistor will suffer similar negative results as decreasing the dopant concentration. However, bipolar transistor 100 including split collector region 150 experiences a minor increase in resistance to charge transfer. In comparison with a bipolar transistor having a collector region having a uniform high dopant concentration, bipolar transistor exhibits merely a 15% increase in resistance. The significant decrease in turn-off time combined with the small increase in resistance, increases applicability of bipolar transistor 100 to a wide variety of circuits.

Figure 4:
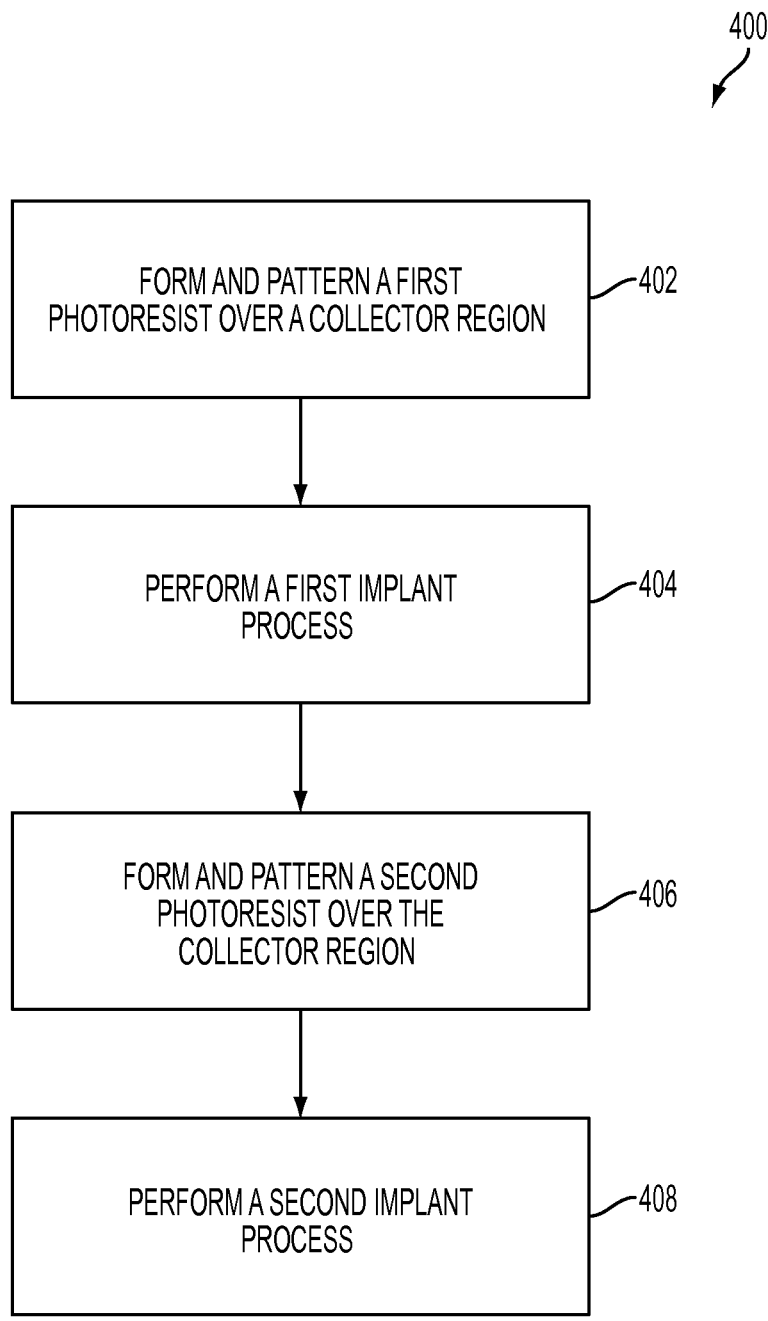
FIG. 4 is flow chart of a method of making a split collector region in accordance with one or more embodiments.

FIG. 4 is flow chart of a method 400 of making a split collector region in accordance with one or more embodiments. Method 400 begins with operation 402 in which a first photoresist is patterned over a collector region of a bipolar transistor. The first photoresist is formed by a suitable process, such as spin-on coating, and then patterned to form a patterned photoresist feature by a proper lithography patterning method. In some embodiments, the pattern of the photoresist is developed by a dry etching process, a wet etching process or another suitable developing process. In some embodiments, a hard mask layer is formed between underneath the photoresist. The patterned photoresist layer is formed on the hard mask layer. The pattern of the photoresist layer is transferred to the hard mask layer. In some embodiments, the hard mask layer includes silicon nitride, silicon oxynitride, silicon carbide, and/or other suitable dielectric materials, and is formed using a method such as CVD or PVD.

In some embodiments, the first photoresist is patterned to define a lightly doped peripheral region, e.g., lightly doped peripheral region 154 (FIG. 1), of the collector region. In some embodiments, the lightly doped peripheral region has a length ranging from about 0.5 µm to about 3 µm. In some embodiments, the first photoresist is patterned to define a highly doped central region, e.g., highly doped central region 152, of the collector region. In some embodiments, the highly doped peripheral region has a length ranging from about 8 µm to about 27 µm. In some embodiments, the first photoresist is patterned to define an entirety of the collector region, e.g., split collector region 150. In some embodiments, the collector region has a length ranging from about 10 µm to about 30 µm.

Method 400 continues with operation 404 in which a first implant process is performed. In some embodiments, the first implant process includes an ion implantation process followed by an anneal process to active implanted dopants. In some embodiments, the implantation process implants p-type dopants, such as boron, boron difluoride, gallium or other suitable p-type dopants, into the bipolar transistor. In some embodiments, the implantation process implants n-type dopants, such as arsenic, phosphorous or other suitable n-type dopants, into the bipolar transistor.

In some embodiments where the first photoresist is patterned to define the lightly doped peripheral region or the entirety of the collector region, the implantation process implants a dopant concentration ranging from about $5\times10^{12}$ ions/$cm^3$ to about $5\times10^{13}$ ions/$cm^3$. In some embodiments where the first photoresist is patterned to define the highly doped central region, the implantation process implants a dopant concentration ranging from about $5\times10^{14}$ ions/$cm^3$ to about $5\times10^{15}$ ions/$cm^3$.

In some embodiments, the first photoresist is removed following the first implant process. In some embodiments, the first photoresist is removed using an ashing process, an etching process or another suitable removal process.

Figure 5A:
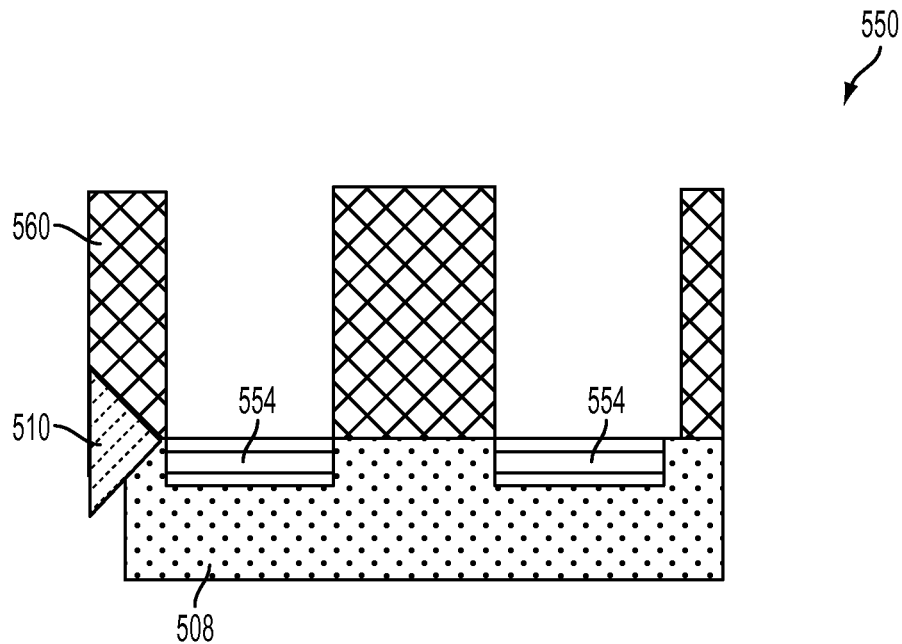
FIGS. 5A and 5B are cross-sectional views of a split collector region during various points of manufacturing in accordance with one or more embodiments.
Figure 5B:
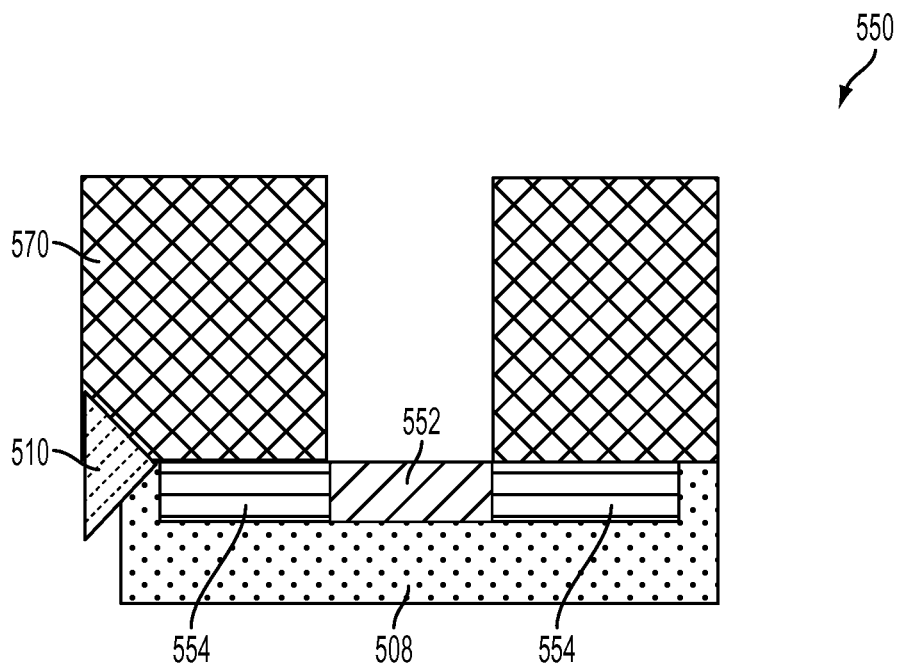

FIG. 5A is a cross-sectional view of a split collector region 550 following operation 404 in accordance with one or more embodiments. Split collector region 550 is similar to split collector region 150, similar elements have a same reference number increased by 400. In the embodiment of FIG. 5A, a first photoresist 560 is patterned to define a lightly doped peripheral region 554. In some embodiments, first photoresist 560 is patterned to define an entirety of split collector region 550. In some embodiments, first photoresist 560 is patterned to define a highly doped central region 552 (FIG. 5B).

Method 400 continues with operation 406 in which a second photoresist is patterned over the collector region. The second photoresist is formed by a suitable process, such as spin-on coating, and then patterned to form a patterned photoresist feature by a proper lithography patterning method. In some embodiments, the second photoresist is formed using a same process as the first photoresist. In some embodiments, the second photoresist is formed using a different process from the first photoresist. In some embodiments, the pattern of the second photoresist is developed by a dry etching process, a wet etching process or another suitable developing process. In some embodiments, the second photoresist is developed using a same process as the first photoresist. In some embodiments, the second photoresist is developed using a different process from the first photoresist. In some embodiments, a hard mask layer is formed between underneath the second photoresist. The patterned second photoresist is formed on the hard mask layer. The pattern of the second photoresist layer is transferred to the hard mask layer. In some embodiments, the hard mask layer includes silicon nitride, silicon oxynitride, silicon carbide, and/or other suitable dielectric materials, and is formed using a method such as CVD or PVD.

In some embodiments, the second photoresist is patterned to define a lightly doped peripheral region, e.g., lightly doped peripheral region 154 (FIG. 1), of the collector region. In some embodiments, the lightly doped peripheral region has a length ranging from about 0.5 µm to about 3 µm. In some embodiments, the second photoresist is patterned to define a highly doped central region, e.g., highly doped central region 152, of the collector region. In some embodiments, the highly doped peripheral region has a length ranging from about 8 µm to about 27 µm.

In some embodiments where the first photoresist defines the lightly doped peripheral region or the entirety of the collector region, the second photoresist defines the highly doped central region. In some embodiments where the first photoresist defines the highly doped central region, the second photoresist defines the lightly doped peripheral region.

Method 400 continues with operation 408 in which a second implant process is performed. In some embodiments, the second implant process includes an ion implantation process followed by an anneal process to active implanted dopants. In some embodiments, the second implantation process implants p-type dopants, such as boron, boron difluoride, gallium or other suitable p-type dopants, into the bipolar transistor. In some embodiments, the second implantation process implants n-type dopants, such as arsenic, phosphorous or other suitable n-type dopants, into the bipolar transistor.

In some embodiments where the second photoresist is patterned to define the lightly doped peripheral region, the implantation process implants a dopant concentration ranging from about $5 \times 10^{12}$ ions/cm$^3$ to about $5 \times 10^{13}$ ions/cm$^3$. In some embodiments where the second photoresist is patterned to define the highly doped central region, the implantation process implants a dopant concentration ranging from about $5 \times 10^{14}$ ions/cm$^3$ to about $5 \times 10^{15}$ ions/cm$^3$.

In some embodiments, the second photoresist is removed following the second implant process. In some embodiments, the second photoresist is removed using an ashing process, an etching process or another suitable removal process.

FIG. 5B is a cross-sectional view of split collector region 550 following operation 408 in accordance with one or more embodiments. In the embodiment of FIG. 5B, a second photoresist 570 is patterned to define highly doped central region 552. In some embodiments, second photoresist 570 is patterned to define a lightly doped peripheral region 554 (FIG. 5A).

One of ordinary skill in the art would recognize that additional operations before or after the described operations of method 400 are used to form a functional bipolar transistor. One of ordinary skill in the art would also recognize that back end processes are also possible to provide connection between the bipolar transistor and other devices within a circuit.

The back end process include forming interconnect structures over the bipolar transistor. In some embodiments, the interconnect structure connects to an emitter region and the split collector region. In some embodiments, the interconnect structure connects to a gate structure.

In some embodiments, the interconnect structure includes an interlayer dielectric (ILD) and a multilayer interconnect (MLI) structure in a configuration such that the ILD separates and isolates each metal layer from other metal layers. In furtherance of the example, the MLI structure includes contacts, vias and metal lines formed on the substrate. In one example, the MLI structure may include conductive materials, such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect is used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

The ILD material includes silicon oxide. Alternatively or additionally, the ILD includes a material having a low dielectric constant, such as a dielectric constant less than about 3.5. In one embodiment, the dielectric layer includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric layer may be formed by a technique including spin-on, CVD, or other suitable processes.

An aspect of this description relates to a bipolar transistor. The bipolar transistor includes a substrate and a first well in the substrate, the first well having a first dopant type. The bipolar transistor further includes a split collector region in the first well. The split collector region includes a highly doped central region having a second dopant type opposite the first dopant type; and a lightly doped peripheral region having the second dopant type, the lightly doped peripheral region surrounding the highly doped central region. A dopant concentration of the lightly doped peripheral region is less than a dopant concentration of the highly doped central region.

Another aspect of this description relates to a lateral insulation gate bipolar transistor (LIGBT). The LIGBT includes a substrate; a first well in the substrate, the first well having a first dopant type; and a second well in the substrate, the second well having a second dopant type opposite the first dopant type. The LIGBT further includes a field oxide over a top surface of the substrate; an emitter region in the second well; and a gate structure partially overlapping the field oxide. The LIGBT further includes a split collector region in the first well. The split collector region includes a highly doped central region having the second dopant type; and a lightly doped peripheral region having the second dopant type, the lightly doped peripheral region surrounding the highly doped central region. A dopant concentration of the lightly doped peripheral region is less than a dopant concentration of the highly doped central region.

Still another aspect of this description relates to a method of making a bipolar transistor. The method includes patterning a first photoresist over a collector region of the bipolar transistor, the first photoresist defining a first opening. The method further includes performing a first implantation process through the first opening. The method further includes patterning a second photoresist over the collector region, the second photoresist defining a second opening different from the first opening. The method further includes performing a second implantation process through the second opening, wherein a dopant concentration resulting from the second implantation process is different from a dopant concentration resulting from the first implantation process.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A bipolar transistor comprising:
   a substrate;
   a first well in the substrate, the first well having a first dopant type; and
   a split collector region in the first well, the split collector region comprising:
      a highly doped central region having a second dopant type opposite the first dopant type; and
      a lightly doped peripheral region having the second dopant type, the lightly doped peripheral region surrounding the highly doped central region, wherein a dopant concentration of the lightly doped peripheral region is less than a dopant concentration of the highly doped central region, the dopant concentration of the lightly doped peripheral region ranges from about $5\times10^{12}$ ions/cm$^3$ to about $5\times10^{13}$ ions/cm$^3$, and the lightly doped peripheral region has a same maximum depth as the highly doped central region.

2. The bipolar transistor of claim 1, wherein the split collector region has an overall length ranging from about 10 microns (μm) to about 30 μm.

3. The bipolar transistor of claim 1, wherein a ratio of a length of the highly doped central region to an overall length of the split collector region ranges from about 0.8 to about 0.9.

4. The bipolar transistor of claim 1, wherein the dopant concentration of the lightly doped peripheral region is about 100 times less than the dopant concentration of the highly doped central region.

5. The bipolar transistor of claim 1, wherein a length of the lightly doped peripheral region on one side of the highly doped central region ranges from about 0.5 μm to about 3 μm.

6. The bipolar transistor of claim 1, wherein the first dopant type is n-type.

7. The bipolar transistor of claim 1, further comprising a field oxide, wherein the split collector region directly contacts the field oxide.

8. A lateral insulation gate bipolar transistor (LIGBT) comprising:
   a substrate;
   a first well in the substrate, the first well having a first dopant type;
   a second well in the substrate, the second well having a second dopant type opposite the first dopant type;
   a field oxide over a top surface of the substrate;
   an emitter region in the second well;
   a gate structure partially overlapping the field oxide; and
   a split collector region in the first well, the split collector region comprising:
      a highly doped central region having the second dopant type; and
      a lightly doped peripheral region having the second dopant type, the lightly doped peripheral region surrounding the highly doped central region, wherein a dopant concentration of the lightly doped peripheral region is less than a dopant concentration of the highly doped central region, a ratio of a length of the highly doped central region to an overall length of the split collector region ranges from about 0.8 to about 0.9, and a bottom surface of the lightly doped peripheral region is substantially coplanar with a bottom surface of the highly doped central region.

9. The LIGBT of claim 8, wherein the split collector region has an overall length ranging from about 10 microns (μm) to about 30 μm.

10. The LIGBT of claim 8, wherein the dopant concentration of the lightly doped peripheral region ranges from about $5\times10^{12}$ ions/cm$^3$ to about $5\times10^{13}$ ions/cm$^3$.

11. The LIGBT of claim 8, wherein the dopant concentration of the lightly doped peripheral region is about 50 times to about 200 times less than the dopant concentration of the highly doped central region.

12. The LIGBT of claim 8, wherein a length of the lightly doped peripheral region on either side of the highly doped central region ranges from about 0.5 μm to about 3 μm.

13. The LIGBT of claim 8, wherein the first dopant type is n-type.

14. The LIGBT of claim 8, wherein the emitter region comprises:
   a first emitter region having the first dopant type; and
   a second emitter region having the second dopant type, wherein the first emitter region is between the gate structure and the second emitter region.

15. The LIGBT of claim 8, wherein the gate structure overlaps a portion of the second well.

16. The LIGBT of claim 8, wherein the split collector region directly contacts the field oxide.

17. A bipolar transistor comprising:
   a substrate;
   a field oxide over the substrate;
   a gate partially overlapping the field oxide;
   a first well in the substrate, wherein the first well is on an opposite side of the field oxide from the gate, and the first well having a first dopant type; and
   a split collector region in the first well, the split collector region comprising:
      a highly doped central region having a second dopant type opposite the first dopant type, wherein a bottom surface of the highly doped central region directly contacts the first well;
      a lightly doped peripheral region having the second dopant type, the lightly doped peripheral region surrounding the highly doped central region, wherein a dopant concentration of the lightly doped peripheral region is less than a dopant concentration of the highly doped central region, and a ratio of a length of the highly doped central region to a length of the split collector region ranges from about 0.8 to about 0.9; and
   a deep well under the field oxide, wherein the deep well has the first dopant type.

18. The bipolar transistor of claim 17, wherein the dopant concentration of the highly doped central region is about 50 times to about 200 times greater than the dopant concentration of the lightly doped peripheral region.

19. The bipolar transistor of claim 17, further comprising a field oxide, wherein the split collector region directly contacts the field oxide.

20. The bipolar transistor of claim 17, wherein a length of the lightly doped peripheral region on a first side of the highly doped central region is equal to a length of the lightly doped peripheral region on a second side of the highly doped central region, and the first side is opposite the second side.

* * * * *